(12) United States Patent
Choksi

(10) Patent No.: US 8,971,219 B2
(45) Date of Patent: Mar. 3, 2015

(54) HYBRID TRANSFORMER BASED INTEGRATED DUPLEXER FOR MULTI-BAND/MULTI-MODE RADIO FREQUENCY (RF) FRONT END

(71) Applicant: QUALCOMM Incorporated, San Diego, CA (US)

(72) Inventor: Ojas M. Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 133 days.

(21) Appl. No.: 13/735,795

(22) Filed: Jan. 7, 2013

(65) Prior Publication Data

US 2013/0258911 A1 Oct. 3, 2013

Related U.S. Application Data

(60) Provisional application No. 61/618,502, filed on Mar. 30, 2012.

(51) Int. Cl.
*H04L 5/14* (2006.01)
*H03H 7/46* (2006.01)
*H03H 7/09* (2006.01)
*H04B 1/44* (2006.01)

(52) U.S. Cl.
CPC ............ *H03H 7/463* (2013.01); *H04L 5/14* (2013.01); *H03H 7/468* (2013.01); *H03H 7/466* (2013.01); *H03H 7/09* (2013.01)
USPC ........... 370/276; 370/277; 370/282; 370/284; 333/129

(58) Field of Classification Search
USPC ................... 370/276, 277, 282, 284
See application file for complete search history.

(56) References Cited

U.S. PATENT DOCUMENTS

| | | |
|---|---|---|
| 3,699,444 A | 10/1972 | Ghose et al. |
| 4,747,160 A | 5/1988 | Bossard |
| 5,179,302 A | 1/1993 | Wagner |
| 6,211,671 B1 | 4/2001 | Shattil |
| 7,142,811 B2 | 11/2006 | Terranova et al. |
| 7,236,802 B2 | 6/2007 | Cairo |
| 7,372,327 B2 | 5/2008 | Westwick et al. |

(Continued)

FOREIGN PATENT DOCUMENTS

| | | |
|---|---|---|
| EP | 2296286 A2 | 3/2011 |
| EP | 2393211 A2 | 12/2011 |

(Continued)

OTHER PUBLICATIONS

Mikhemar, et al., "A Tunable Integrated Duplexer with 50dB Isolation in 40nm CMOS," ISSCC 2009, paper 22.7, 2009, pp. 386-387.

(Continued)

*Primary Examiner* — Farah Faroul
(74) *Attorney, Agent, or Firm* — James Gutierrez

(57) ABSTRACT

An integrated duplexer based on electrical balance is described. The duplexer module includes a hybrid transformer. The hybrid transformer includes a primary coil and a secondary coil. The primary coil is coupled between an output of a power amplifier and an antenna. The secondary coil is coupled between an input of a low noise amplifier and ground. The duplexer also includes a balancing impedance that is coupled between the primary coil and the secondary coil.

26 Claims, 13 Drawing Sheets

(56) References Cited

U.S. PATENT DOCUMENTS

| | | |
|---|---|---|
| 7,848,713 B2 | 12/2010 | Cabanillas et al. |
| 8,005,448 B1 | 8/2011 | Yan et al. |
| 8,090,044 B2 | 1/2012 | Rofougaran |
| 8,208,865 B2 | 6/2012 | Mikhemar et al. |
| 8,521,117 B1* | 8/2013 | Gupta et al. .................. 455/296 |
| 2003/0022638 A1 | 1/2003 | Imai et al. |
| 2003/0235160 A1 | 12/2003 | Saifuddin |
| 2007/0105509 A1 | 5/2007 | Muhammad et al. |
| 2008/0009257 A1 | 1/2008 | Safarian et al. |
| 2008/0242245 A1 | 10/2008 | Aparin |
| 2008/0303609 A1* | 12/2008 | Abe et al. ...................... 333/124 |
| 2009/0117855 A1 | 5/2009 | Rofougaran |
| 2009/0156152 A1 | 6/2009 | Sahota et al. |
| 2009/0186582 A1 | 7/2009 | Muhammad et al. |
| 2009/0213770 A1 | 8/2009 | Mu |
| 2009/0253385 A1 | 10/2009 | Dent et al. |
| 2010/0029323 A1 | 2/2010 | Tasic et al. |
| 2010/0080270 A1 | 4/2010 | Chen et al. |
| 2010/0271987 A1 | 10/2010 | Chiu et al. |
| 2010/0295629 A1* | 11/2010 | Klemens et al. .............. 333/126 |
| 2011/0053525 A1 | 3/2011 | Yi |
| 2011/0064005 A1 | 3/2011 | Mikhemar et al. |
| 2011/0068636 A1 | 3/2011 | Lee et al. |
| 2011/0128088 A1* | 6/2011 | Jin et al. .......................... 333/25 |
| 2011/0158135 A1 | 6/2011 | Mikhemar et al. |
| 2012/0098549 A1* | 4/2012 | Wang et al. ................... 324/649 |
| 2012/0188024 A1* | 7/2012 | Yamanouchi ................. 332/108 |
| 2012/0295553 A1 | 11/2012 | Sahota |
| 2013/0109330 A1 | 5/2013 | Sahota et al. |
| 2013/0259099 A1 | 10/2013 | Gudem et al. |
| 2013/0259102 A1 | 10/2013 | Gudem et al. |
| 2013/0343237 A1 | 12/2013 | Mikhemar et al. |
| 2014/0085951 A1* | 3/2014 | Kaeriyama et al. ........... 363/126 |

FOREIGN PATENT DOCUMENTS

| | | |
|---|---|---|
| GB | 1123416 A | 8/1968 |
| WO | 2005050896 A2 | 6/2005 |
| WO | 2011104313 A1 | 9/2011 |

OTHER PUBLICATIONS

Mikhemar, et al., "An On-Chip Wideband and Low-Loss Duplexer for 3G/4G CMOS Radios," IEEE Symposium on VLSI Circuits 2010, pp. 129-130.

Pursula, et al., "Hybrid Transformer-Based Adaptive RF Front End for UHF RFID Mobile Phone Readers," IEEE International Conference on RFID, 2008, pp. 150-155.

Sartori, Eugene F., "Hybrid Transformers," IEEE Transactions on Parts, Materials and Packaging, vol. 4, No. 3, Sep. 1968, pp. 59-66.

Sorsby et al.,"Practical High-Efficiency Partial-Envelope Tracking Power Amplifier System with Broadband Applications", IEEE Radio and Wireless Symposium (RWS) [Online], pp. 104-107.(2010).

Wu et al., "A High IIP2 Gilbert Mixer-Based Downconverter Design for Direct-Conversion WiMAX Receivers", IEEE Radio and Wireless Symposium (RWS) [Online] pp. 404-407 (2010).

Darabi, et al., "Highly Integrated and Tunable RF Front Ends for Reconfigurable Multiband Transceivers: A Tutorial," IEEE Transactions on Circuits and Systems, Regular Papers, vol. 58, No. 9, Sep. 2011, pp. 2038-2050.

International Search Report and Written Opinion—PCT/US2013/034740—ISA/EPO—Jun. 28, 2013.

* cited by examiner

HYBRID TRANSFORMER BASED INTEGRATED DUPLEXER FOR MULTI-BAND/MULTI-MODE RADIO FREQUENCY (RF) FRONT END

CLAIM OF PRIORITY UNDER 35 U.S.C. §119

The present Application for Patent claims priority to Provisional Application No. 61/618,502, entitled "HYBRID TRANSFORMER WITH INTEGRATED DUPLEXER FOR MULTI-BAND/MULTI-MODE RF FRONT END" filed Mar. 30, 2012, and assigned to the assignee hereof and hereby expressly incorporated by reference herein.

TECHNICAL FIELD

The present disclosure relates generally to wireless communication systems. More specifically, the present disclosure relates to systems and methods for implementing a hybrid transformer based integrated duplexer for multi-band/multi-mode RF front end.

BACKGROUND

Wireless communication systems are widely deployed to provide various types of communication content such as voice, video, data and so on. These systems may be multiple-access systems capable of supporting simultaneous communication of multiple mobile devices with one or more base stations.

Reductions in both the size and cost of mobile devices and base stations may increase their marketability. Devices in wireless communication systems are increasingly configured to operate on multiple radio frequency (RF) bands utilizing multiple transmission technologies. One such way to reduce both the size and cost of mobile devices and base stations is the use of duplexers. However, a device that operates on multiple radio frequency (RF) bands and that utilizes multiple transmission technologies has traditionally required a separate duplexer for each radio frequency (RF) band and for each transmission technology. Traditionally, these separate duplexers have design constraints that prevent them from being used in integrated circuits. Instead, discrete duplexers have been used, increasing both the cost and printed circuit board area. Benefits may be realized by an improved duplexer that is integrated in an integrated circuit.

SUMMARY

A duplexer is described. The duplexer includes a hybrid transformer. The hybrid transformer includes a primary coil coupled between an output of a power amplifier and an antenna. The hybrid transformer also includes a secondary coil coupled between an input of a low noise amplifier and ground. The duplexer also includes a balancing impedance that is coupled between the primary coil and the secondary coil.

A coupling may occur between the primary coil and the secondary coil. A transmit signal may be input to the power amplifier. A receive signal may be output from the low noise amplifier. The antenna may be capable of simultaneously transmitting and receiving. A ratio of turns for the primary coil to the secondary coil may be $N_1:N_2$. The balancing impedance may be tuned to equal $(N_2/N_1)$ multiplied by an impedance of the antenna.

The primary coil may include two terminals. The secondary coil may also include two terminals. The balancing impedance may be tuned during transmission such that the two terminals of the primary coil and the two terminals of the secondary coil are shorted at transmit signal frequencies. The balancing impedance may be tuned during reception such that the balancing impedance is shorted at receive signal frequencies. The low noise amplifier may be a differential low noise amplifier with a first differential input and a second differential input. The secondary coil may be coupled to ground. A tertiary coil may be coupled between the first differential input and the second differential input.

A first coupling may occur between the primary coil and the secondary coil and a second coupling may occur between the primary coil and the tertiary coil. The low noise amplifier may be a differential low noise amplifier with a first differential input and a second differential input. The duplexer may further include a first capacitor coupled between the first differential input and an antenna. The duplexer may also include a second capacitor coupled between the second differential input and the output of the power amplifier.

A method for simultaneously transmitting and receiving is described. A receive signal is received using an antenna. The receive signal is provided to a low noise amplifier via a duplexer that includes a hybrid transformer. A transmit signal is received from a power amplifier. The transmit signal is provided to the antenna via the duplexer.

A wireless device configured for simultaneously transmitting and receiving is also described. The wireless device includes means for receiving a receive signal using an antenna. The wireless device also includes means for providing the receive signal to a low noise amplifier via a duplexer that includes a hybrid transformer. The wireless device further includes means for receiving a transmit signal from a power amplifier. The wireless device also includes means for providing the transmit signal to an antenna via the duplexer.

A computer-program product for simultaneous transmission and reception is described. The computer-program product includes a non-transitory computer-readable medium having instructions thereon. The instructions include code for causing a wireless device to receive a receive signal using an antenna. The instructions also include code for causing the wireless device to provide the receive signal to a low noise amplifier via a duplexer that includes a hybrid transformer. The instructions further include code for causing the wireless device to receive a transmit signal from a power amplifier. The instructions also include code for causing the wireless device to provide the transmit signal to the antenna via the duplexer.

DETAILED DESCRIPTION

Figure 1A:
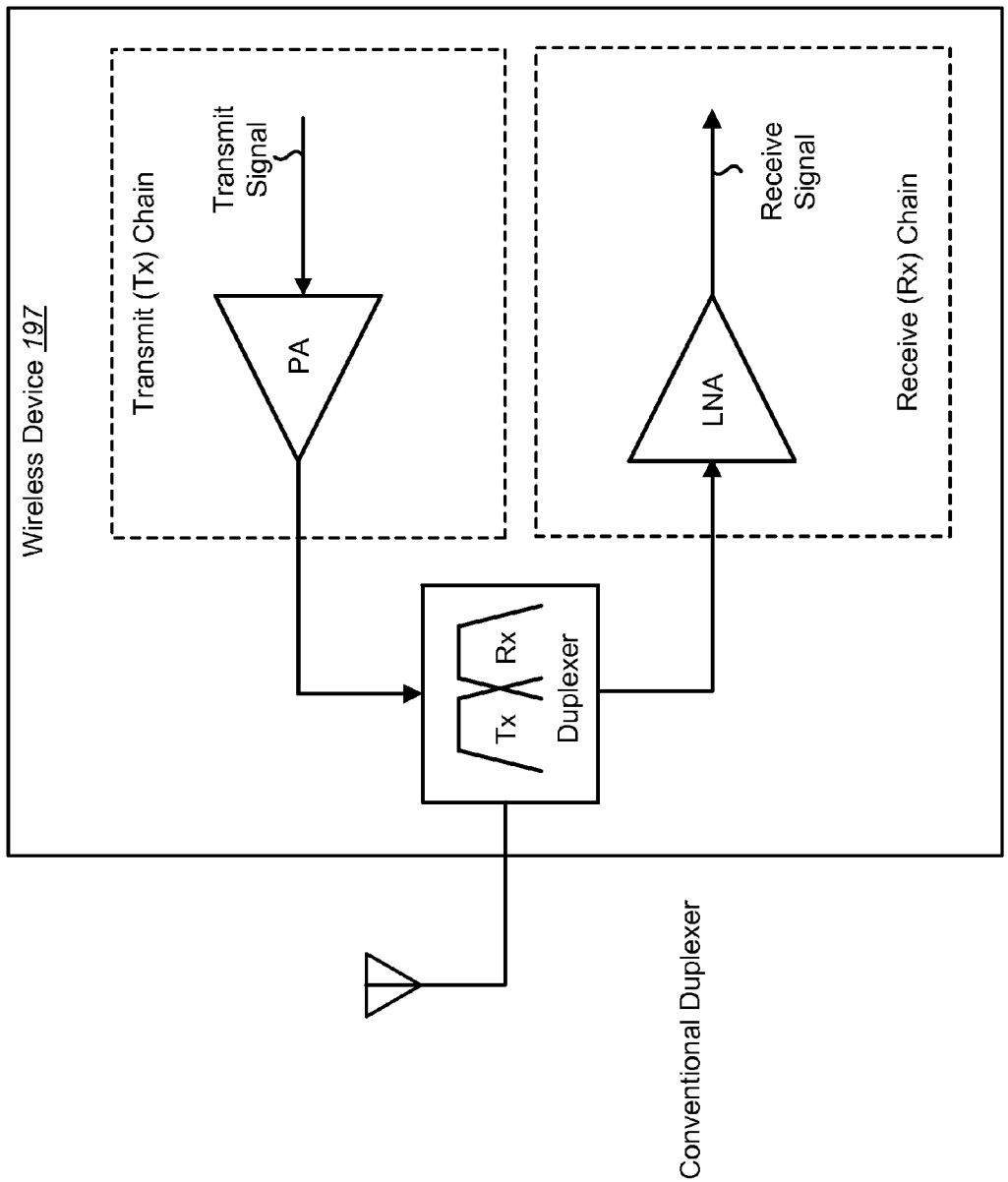
FIG. 1A is a block diagram of a wireless device that includes a conventional duplexer.

FIG. 1A is a block diagram of a wireless device 197 that includes a conventional duplexer. A duplex communication system may include two inter-connected transceivers that communicate with each other in both directions. There are two specific types of duplex communication systems: half duplex and full duplex. In half duplex communication systems, communication happens in one direction at a time. Thus, one transceiver may transmit and the other transceiver may receive at any given point in time. In full duplex communication systems, both transceivers can simultaneously transmit and receive.

Modern wireless and/or mobile communication systems are often full-duplex as specified by the standards that they employ. For example, a common full duplex mobile communication standard includes Universal Telecommunications System (UMTS) and Code Division Multiple Access (CDMA). In these full-duplex communication systems, the transmitter typically uses one carrier frequency in a given frequency band (e.g., 900 megahertz (MHz), 1800 MHz, 1900 MHz, 2100 MHz) and the receiver uses a different carrier frequency in the same frequency band. This scheme, where the transmitter and receiver operate over different frequencies, is referred to as frequency division duplexing (FDD).

Despite using different frequencies, the signal strength of the transmitted signal is often significantly greater than that of the received signal at the transceiver. As such, the receiver is susceptible to interference from the transmitted signal and can be desensitized by the transmitted signal. In order to limit the interference, conventional transceivers include a duplexer, which utilizes frequency selectivity to provide between 50 and 60 decibels (dB) of isolation between the transmitter and the receiver. Thus, modern RF duplexers rely on frequency-selective filters for Tx suppression at the Rx port. Frequency-selective filters may be implemented using a bandpass filter between the Tx port and the antenna port with low insertion loss in the Tx band and a bandpass filter between the antenna port to the Rx port with low insertion loss in the Rx band.

However, to provide for high frequency communication standards, duplexers should be built with high quality factor (Q-factor) and low loss materials, which currently cannot be done using silicon-based technology. As such, conventional duplexers may be fabricated using special materials and processes (e.g., ceramic, surface acoustic wave (SAW), film bulk acoustic wave (FBAR)) that cannot be integrated with a transceiver on a silicon-based integrated circuit for a low cost die.

Thus, modern full-duplex wireless transceivers operate over multiple frequency bands, requiring a discrete off-chip duplexer for each band. This substantially increases the Bill of Materials and the printed circuit board area. Hence, there is a strong need to integrate these duplexers with transceivers, using low-cost silicon-based technology.

The wireless device 197 may include a duplexer coupled to an antenna. The duplexer may route received signals from the antenna to a receive chain while simultaneously routing transmit signals from a transmit chain to the antenna. The transmit chain may include a power amplifier (PA). The receive chain may include a low noise amplifier (LNA).

The wireless device 197 may be configured to provide full-duplex communication. The wireless device 197 may include an RF front end (i.e., the portions illustrated of the wireless device 197). The RF front end may be used within a cellular telephone, a laptop computer, a wireless local area network (WLAN) station, and/or any other device that transmits and receives RF signals. In operation, the RF front end transmits and receives RF signals over non-overlapping portions of a particular frequency band. By transmitting and receiving over the non-overlapping portions of the frequency band, the two signals to not interfere with each other and full-duplex communication can be achieved. For example, both inbound and outbound signals are simultaneously passed through the duplexer and to the antenna over a common signal path.

The duplexer may provide the necessary coupling while preventing strong outbound signals (produced by the power amplifier (PA)) from being coupled to the input of the low noise amplifier (LNA). The duplexer may be a three-port device that includes an antenna port, a transmit port and a receive port. The antenna port may be coupled to the transmit port via a transmit band-pass filter and to the receive port via a receive band-pass filter. The pass band of the transmit band-pass filter may be centered within the frequency range of the outbound signals, which are received from the transmit (Tx) chain. The pass band of the receive band-pass filter may be centered within the frequency range of the inbound signals, which are passed to the receive (Rx) chain.

The transmit band-pass filter and the receive band-pass filter may be configured such that their respective stop bands overlap with the other's pass band. Thus, the band-pass filters may isolate the input of the low noise amplifier (LNA) from the strong outbound signals produced by the power amplifier (PA).

The high frequency communication standards (e.g., FDD-UMTS) dictate that the frequency selective duplexers be built with a very high Q-factor and low loss materials. Current technology does not allow such duplexers to be used in an integrated circuit. Thus, the duplexer may be provided off-chip, increasing the size and cost of the radio transceiver. In addition, recent implementations of full duplex radio transceivers may operate over multiple frequency bands, which require a separate conventional duplexer for each band. In these multi-band transceivers, each duplexer is off chip, increasing the size and cost of the radio transceiver considerably. Thus, there is a need for a duplexer circuit that can be fabricated using silicon-based technology, allowing the duplexer circuit to be implemented on the same integrated circuit as the radio transceiver.

Figure 1B:
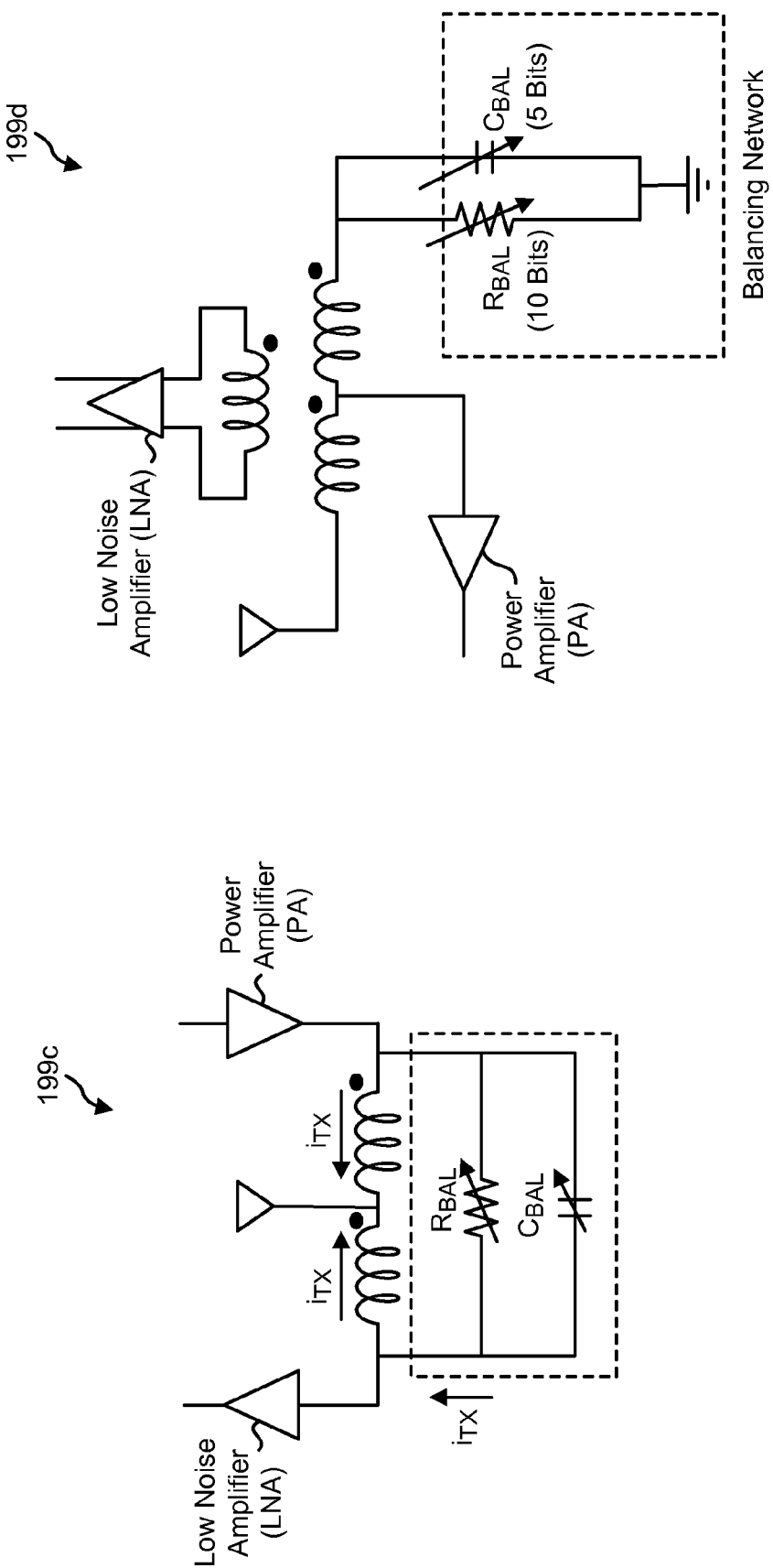
FIG. 1B is a block diagram illustrating an integrated narrow band duplexer and an integrated wideband duplexer.

FIG. 1B illustrates a couple of hybrid transformer topologies. A hybrid transformer may have multiple ports that are simultaneously matched. Furthermore, the ports may be bi-conjugate (i.e., the transmit (Tx) and receive (Rx) ports are electrically isolated from each other; the antenna and the balancing port are also electrically isolated from each other). Finally, the incoming power from one port may be split in any ratio between the two receiving ports.

FIG. 1B illustrates a conventional implementation of an integrated narrow band duplexer 199c and an integrated wideband duplexer 199d. The narrow band duplexer 199c may include a hybrid transformer coupled to a low noise amplifier (LNA) and a power amplifier (PA). The hybrid transformer may include a variable resistor, a variable capacitor and two coils coupled to an antenna. The first coil may be coupled to the low noise amplifier (LNA) and the second coil may be coupled to the power amplifier (PA)

The wideband duplexer 199d may include a first coil $L_1$, a second coil $L_2$ and a third coil $L_3$. A coupling may occur between each of the coils. The coil $L_3$ may be coupled between the differential inputs of a low noise amplifier (LNA). The coil $L_1$ may be coupled between a power amplifier (PA) and an antenna. The coil $L_2$ may be coupled between the power amplifier and a balancing network.

Figure 1C:
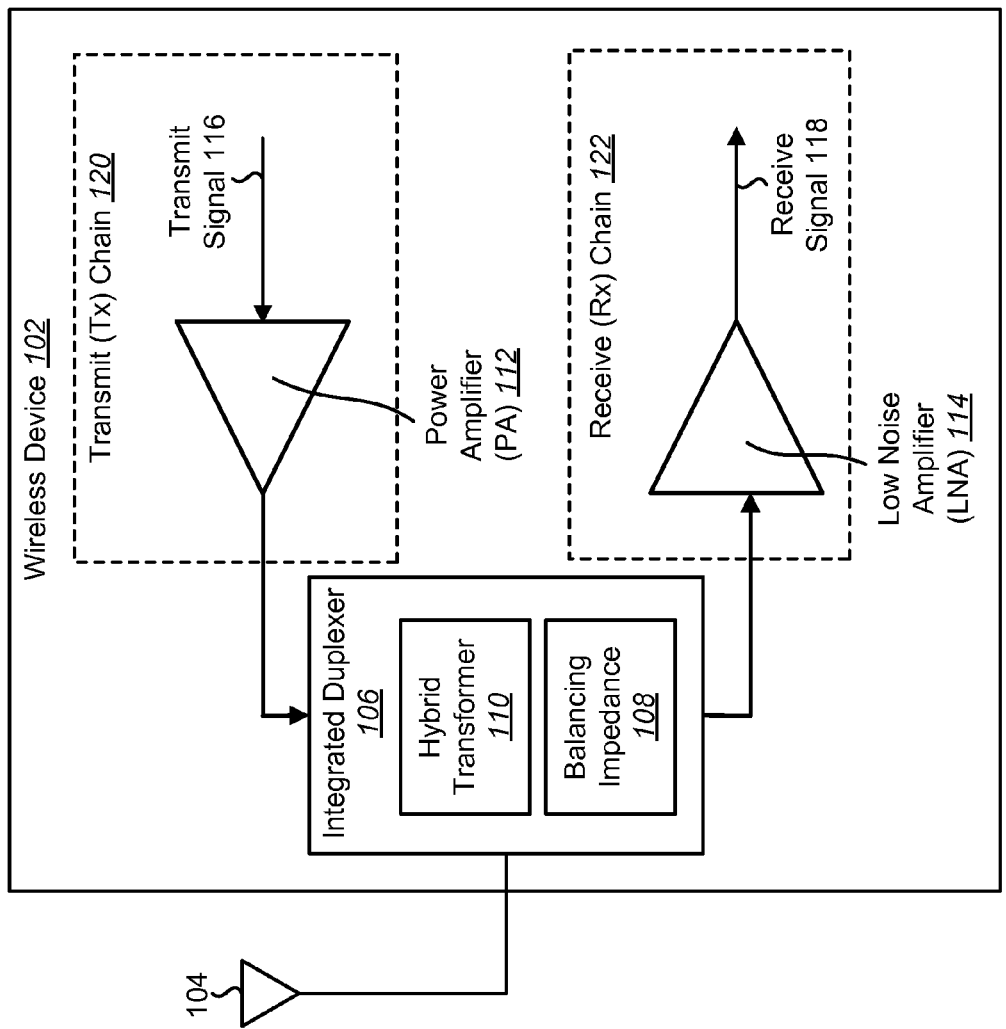
FIG. 1C shows a wireless device configured to operate on multiple radio frequency (RF) bands utilizing multiple wireless radio technologies.

FIG. 1C shows a wireless device 102 configured to operate on multiple radio frequency (RF) bands utilizing multiple wireless radio technologies. The wireless device 102 may operate in a communication system with multiple other wireless devices. Wireless communication systems are widely deployed to provide various types of communication content such as voice, data and so on. A wireless device 102 may be a base station or a wireless communication device.

A base station is a station that communicates with one or more wireless communication devices. A base station may also be referred to as, and may include some or all of the functionality of, an access point, a broadcast transmitter, a NodeB, an evolved NodeB, etc. The term "base station" will be used herein. Each base station provides communication coverage for a particular geographic area. A base station may provide communication coverage for one or more wireless communication devices. The term "cell" can refer to a base station and/or its coverage area depending on the context in which the term is used.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, etc.

A wireless communication device may communicate with zero, one or multiple base stations on the downlink and/or uplink at any given moment. The downlink (or forward link) refers to the communication link from a base station to a wireless communication device, and the uplink (or reverse link) refers to the communication link from a wireless communication device to a base station.

Communications in a wireless system (e.g., a multiple-access system) may be achieved through transmissions over a wireless link. Such a communication link may be established via a single-input and single-output (SISO), multiple-input and single-output (MISO) or a multiple-input and multiple-output (MIMO) system. A MIMO system includes transmitter(s) and receiver(s) equipped, respectively, with multiple ($N_T$) transmit antennas and multiple ($N_R$) receive antennas for data transmission. SISO and MISO systems are particular instances of a MIMO system. The MIMO system can provide improved performance (e.g., higher throughput, greater capacity or improved reliability) if the additional dimensionalities created by the multiple transmit and receive antennas are utilized.

The wireless communication system may utilize MIMO. A MIMO system may support both time division duplex (TDD) and frequency division duplex (FDD) systems. In a TDD system, uplink and downlink signals share the same frequency spectrum. Since the uplink and the downlink are time-multiplexed (i.e., the uplink and downlink signals are sent/received at different times), sharing of the same frequency band is possible. In a FDD system, uplink and downlink signals are simultaneously sent and hence, they occupy different frequency bands.

The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The terms "networks" and "systems" are often used interchangeably. A CDMA network may implement a radio technology such as Universal Terrestrial Radio Access (UTRA), cdma2000, etc. UTRA includes W-CDMA and Low Chip Rate (LCR) while cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDMA, etc. UTRA, E-UTRA and GSM are part of Universal Mobile Telecommunication System (UMTS). Long Term Evolution (LTE) is a release of UMTS that uses E-UTRA. UTRA, E-UTRA, GSM, UMTS and Long Term Evolution (LTE) are described in documents from an organization named "3rd Generation Partnership Project" (3GPP). cdma2000 is described in documents from an organization named "3rd Generation Partnership Project 2" (3GPP2). For clarity, certain aspects of the techniques are described below for Long Term Evolution (LTE), and Long Term Evolution (LTE) terminology is used in much of the description below.

A wireless device 102 may be capable of operating on multiple radio frequency (RF) bands (referred to as multi-band). A wireless device 102 may also be capable of utilizing multiple radio technologies, such as those discussed above (referred to as multi-mode). Typically, a wireless device χthat is both multi-band and multi-mode may include discrete duplexers, power amplifiers (PAs) and dedicated low noise amplifier (LNA) inputs for each radio frequency (RF) band and sometimes for each radio technology.

As the number of radio frequency (RF) bands and radio technologies used by a single wireless device 102 increases, the size, cost and complexity of the wireless device 102 also increases. The one or more duplexers may occupy a significant portion of printed circuit board (PCB) area. An alternative implementation of a duplexer 106 may be based on the electrical balance of a hybrid transformer 110, rather than the frequency selectivity. Using a duplexer 106 based on the electrical balance of a hybrid transformer 110 may be more suitable for integration in CMOS, since the duplexer 106 does not rely on frequency selectivity, which requires a very high Q element and expensive technologies.

The integrated duplexer 106 may provide wideband isolation using electrical balance, as opposed to a conventional duplexer that provides isolation using frequency selection. The portions of the wireless device 102 shown may be referred to as the RF front end. The RF front end may be used within any device that transmits and receives RF signals. By transmitting and receiving over the non-overlapping portions of the frequency band, the two signals to not interfere with each other and full-duplex communication can be achieved. For example, both inbound and outbound signals are simultaneously passed through the duplexer 106 and to the antenna 104 over a common signal path.

The use of electrical balance of a hybrid transformer 110 to isolate the transmit port from the receive port is discussed in additional detail below in relation to FIG. 2. The power of the strong outbound signals provided by the power amplifier (PA) 112 may be split by the integrated duplexer 106. A first portion of the power is directed towards the antenna 104 and a second portion of the power is directed towards a balancing network (i.e., the balancing impedance 108), where it is dissipated as heat. Ideally, the balancing network is configured to provide an impedance substantially equal to that of the antenna 104, such that the first portion of the power and the second portion of the power are substantially equal (i.e., each receives one half of the power of the strong outbound signal). The integrated duplexer 106 may then effectively isolate the input of the low noise amplifier (LNA) 114 from the strong outbound signals.

In one configuration, the integrated duplexer 106 may be integrated on the same integrated circuit as some or all of the components shown (or portions of the components shown) in the RF front end. The isolation achieved through electrical balance may be a strong function of the matching between the antenna impedance and the balancing impedance. Under matching conditions, half of the transmit power is wasted in the balancing impedance 108. Thus, the integrated duplexer may suffer from a fundamental 3 dB Tx insertion loss. The ideal insertion loss for Rx is 3 dB. The insertion loss of the transmit path may be a trade off with the insertion loss of the receive path by skewing the ratio of the number of turns in a primary coil to the number of turns in a secondary coil in the hybrid transformer.

Because the integrated duplexer 106 uses electrical balance (and is thus frequency independent), a single isolation module may be used in a multi-band application that requires full duplex communication over several frequency bands. In other words, the integrated duplexed 106 may be used to provide isolation for multiple different applications that operate over different frequency bands.

Using a hybrid transformer 110 in a duplexer 106 that is integrated on the wireless device 102 may allow the wireless device 102 to operate in multi-band and multi-mode using only a single integrated duplexer 106. Thus, the use of a hybrid transformer in the duplexer may reduce the size, cost and printed circuit board (PCB) routing complexity of a wireless device 102 (because multiple power amplifiers (PAs) 112 and low noise amplifiers (LNAs) 114 are not needed).

The duplexer 106 may include a hybrid transformer 110. A hybrid transformer 110 is a transformer that isolates the transmit and the receive ports through the use of coils. A duplexer 106 that includes a hybrid transformer 110 may be used to isolate transmit signals 116 and receive signals 118. The desirable attributes of a hybrid transformer 110 include Tx-to-Rx isolation, low Tx insertion loss, low Rx insertion loss and Tx common-mode rejection at the Rx inputs. A typical hybrid transformer 110 used in a duplexer 106 may require three coils. However, the proposed hybrid transformer 110 for use in the duplexer 106 uses only two coils. Besides using fewer coils, the use of a hybrid transformer 110 allows the duplexer 106 to operate for both multi-band and multi-mode communications. The hybrid transformer 110 may isolate inputs (i.e., a receive signal 118) from outputs (i.e., a transmit signal 116) using the two coils. The duplexer 106 may also include a balancing impedance 108. The balancing impedance 108 may be a differential tunable impedance.

The duplexer 106 may be coupled to an antenna 104 on the wireless device 102. The duplexer 106 may forward transmit signals 116 to the antenna 104 from a power amplifier (PA) 112 while simultaneously forwarding receive signals 118 from the antenna 104 to a low noise amplifier (LNA) 114. The power amplifier (PA) 112 may be part of a transmit (Tx) chain 120. The low noise amplifier (LNA) 114 may be part of a receive (Rx) chain 122.

In one configuration, the low noise amplifier (LNA) 114 may be single-ended. In this configuration, the input port of the low noise amplifier (LNA) 114 may be coupled to a secondary coil of the hybrid transformer 110. In another configuration, the low noise amplifier (LNA) 114 may be a differential low noise amplifier (LNA) 114 having differential input ports. The differential inputs may be coupled to a tertiary coil of the hybrid transformer 110 or to the primary coil of the hybrid transformer 110. The use of a differential low noise amplifier (LNA) 114 is discussed in additional detail below in relation to FIG. 8 and FIG. 9.

Figure 2:
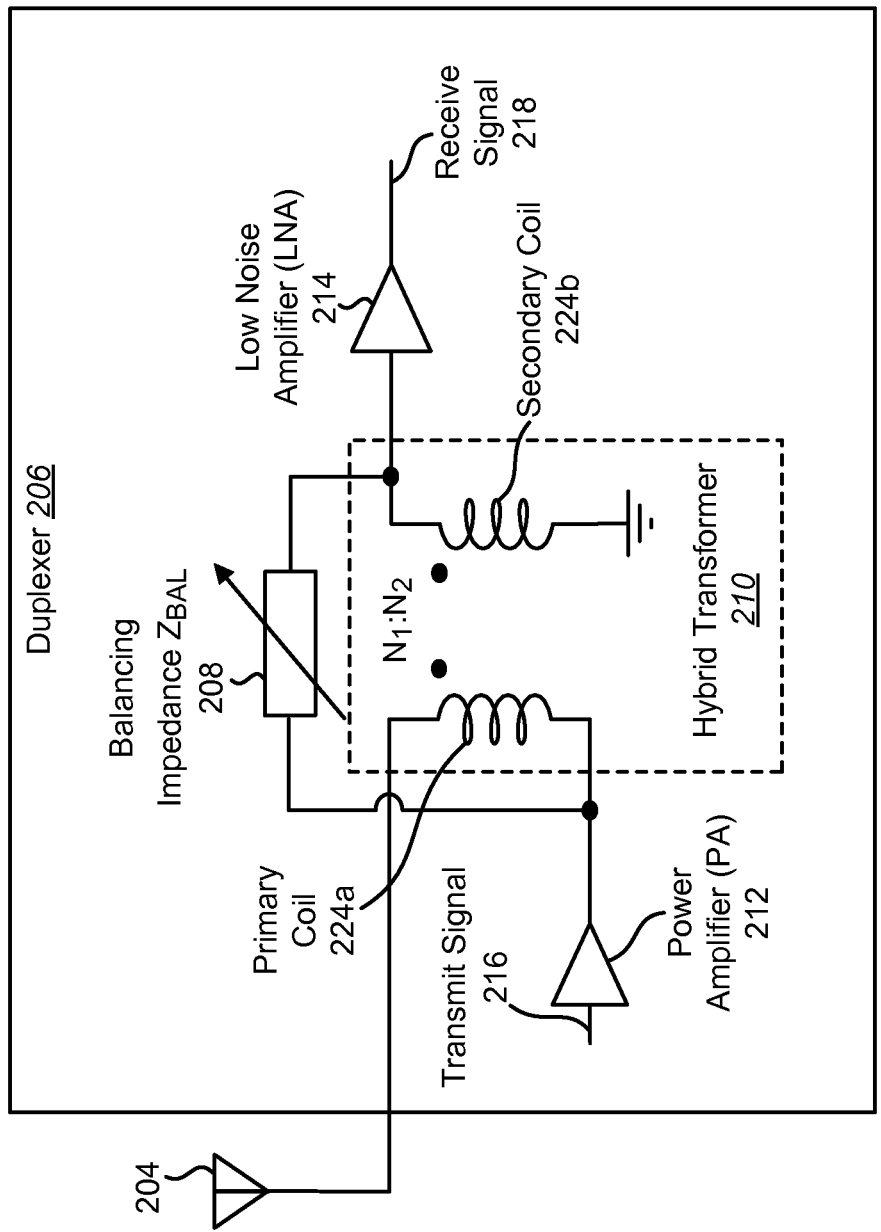
FIG. 2 is a circuit diagram illustrating a duplexer that includes a hybrid transformer.

FIG. 2 is a circuit diagram illustrating a duplexer 206 that includes a hybrid transformer 210. The duplexer 206 of FIG. 2 may be one configuration of the duplexer 106 of FIG. 1. The duplexer 206 may be coupled to an antenna 204 that is capable of simultaneously transmitting and receiving. The duplexer 206 may include a primary coil 224a and a secondary coil 224b that form the hybrid transformer 210. The ratio of turns for the primary coil 224a to the secondary coil 224b may be $N_1:N_2$.

The duplexer 206 may include a power amplifier (PA) 212 that receives a transmit signal 216 from a wireless device 102. The primary coil 224a may be coupled between the output of the power amplifier (PA) 212 and the antenna 204. The secondary coil 224b may be coupled between ground and an input of a low noise amplifier (LNA) 214. In one configuration, the low noise amplifier (LNA) 214 may have a single-ended low noise amplifier (LNA) input port. The low noise amplifier (LNA) 214 may output a receive signal 218 to the wireless device 102. A balancing impedance $Z_{BAL}$ 208 may be coupled between the output of the power amplifier (PA) 212 and the input of the low noise amplifier (LNA) 214. The balancing impedance $Z_{BAL}$ 208 may be a differential tunable impedance, such as a network of several elements connected in series/parallel configurations. In one configuration, the balancing impedance $Z_{BAL}$ 208 may be tuned using antenna impedance tuning circuitry to satisfy Equation (1) below.

$$Z_{BAL} = \left(\frac{N_2}{N_1}\right) \cdot Z_{ANT}. \tag{1}$$

In Equation (1), $Z_{ANT}$ represents the impedance of the antenna 204. When Equation (1) is satisfied, the transmit signal 216 is suppressed at the receive signal port (i.e., the input of the low noise amplifier (LNA) 214). Thus, during transmission, the balancing impedance $Z_{BAL}$ 208 of the duplexer 206 may tune to satisfy Equation (1). The maximum receive power transfer at the receive port also occurs when Equation (1) is satisfied. The operation of the duplexer 206 during transmission is discussed in additional detail below in relation to FIG. 4 and FIG. 5. The operation of the duplexer 206 during reception is discussed in additional detail below in relation to FIG. 6 and FIG. 7.

Figure 3:
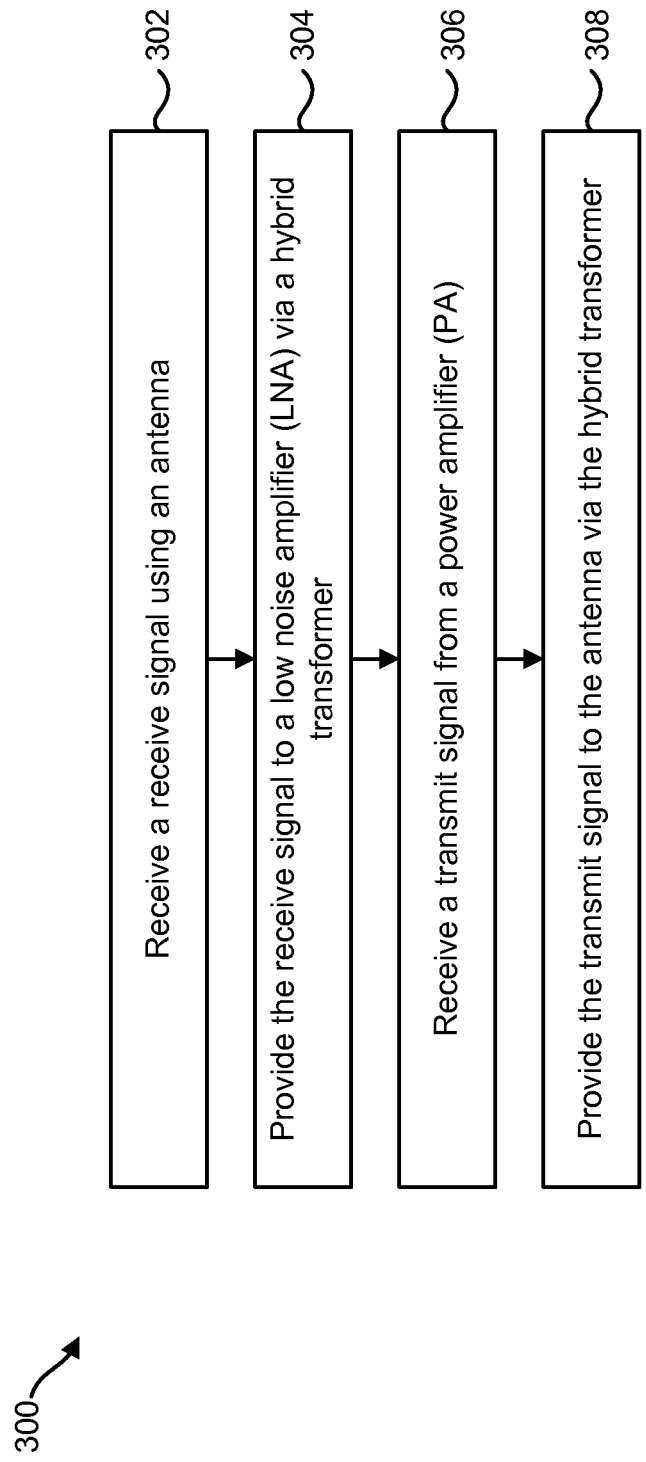
FIG. 3 is a flow diagram of a method for bi-directional communication over a single channel.

FIG. 3 is a flow diagram of a method 300 for bi-directional communication over a single channel. The method 300 may be performed by a wireless device 102. The wireless device 102 may include a duplexer 106 implemented using a hybrid transformer 110. The wireless device 102 may receive 302 a receive signal 118 using an antenna 104. The wireless device 102 may provide 304 the receive signal 118 to a low noise amplifier (LNA) 114 via the hybrid transformer 110. The wireless device 102 may also receive 306 a transmit signal 116 from a power amplifier (PA) 212. The wireless device 102 may provide 308 the transmit signal 116 to the antenna 104 via the hybrid transformer 110.

Figure 4:
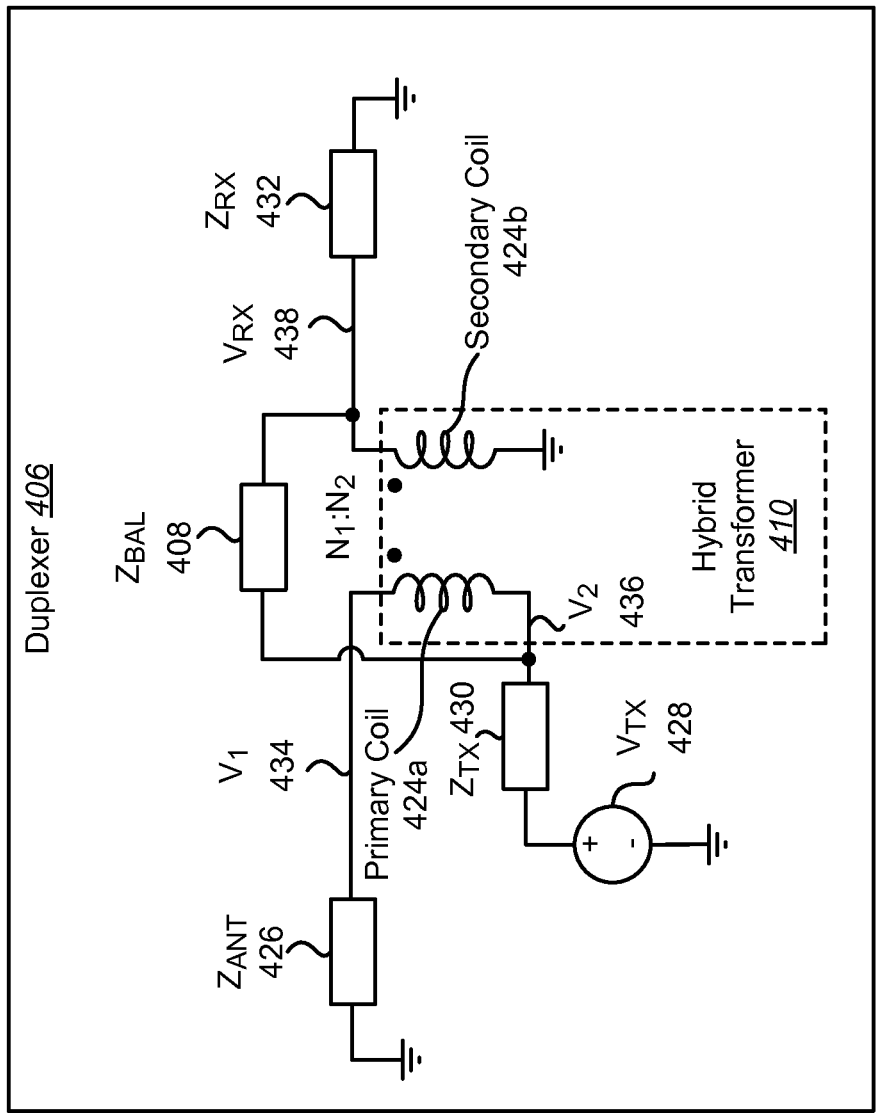
FIG. 4 is a circuit diagram illustrating a theoretical view of a duplexer with a hybrid transformer during transmission.

FIG. 4 is a circuit diagram illustrating a theoretical view of a duplexer 406 with a hybrid transformer 410 during transmission. The duplexer 406 of FIG. 4 may be one configuration of the duplexer 106 of FIG. 1. FIG. 4 illustrates how the transmit signal 116 is suppressed at the receive port. The duplexer 406 may include a hybrid transformer 410 with a primary coil 424a and a secondary coil 424b. The ratio of turns for the primary coil 424a to the secondary coil 424b may be $N_1:N_2$. During transmission, the power amplifier (PA) 112 may be viewed as a Thevenin equivalent voltage source $V_{TX}$ 428 and an impedance $Z_{TX}$ 430 coupled to each other. The voltage source $V_{TX}$ 428 may be coupled to ground while the impedance $Z_{TX}$ 430 is coupled to both the primary coil 424a of the hybrid transformer 410 and the balancing impedance $Z_{BAL}$ 408.

During transmission, the antenna 104 may be viewed as an impedance $Z_{ANT}$ 426 coupled between the primary coil 424a and ground. Likewise, during transmission, the low noise amplifier (LNA) 114 may be viewed as an impedance $Z_{RX}$ 432 coupled between ground and both the balancing impedance $Z_{BAL}$ 408 and the secondary coil 424b. The voltage across the impedance $Z_{ANT}$ 426 may be $V_1$ 434. The voltage between the impedance $Z_{TX}$ 430 and the primary coil 424a may be $V_2$ 436. The voltage across the impedance $Z_{RX}$ 432 may be $V_{RX}$ 438.

Figure 5:
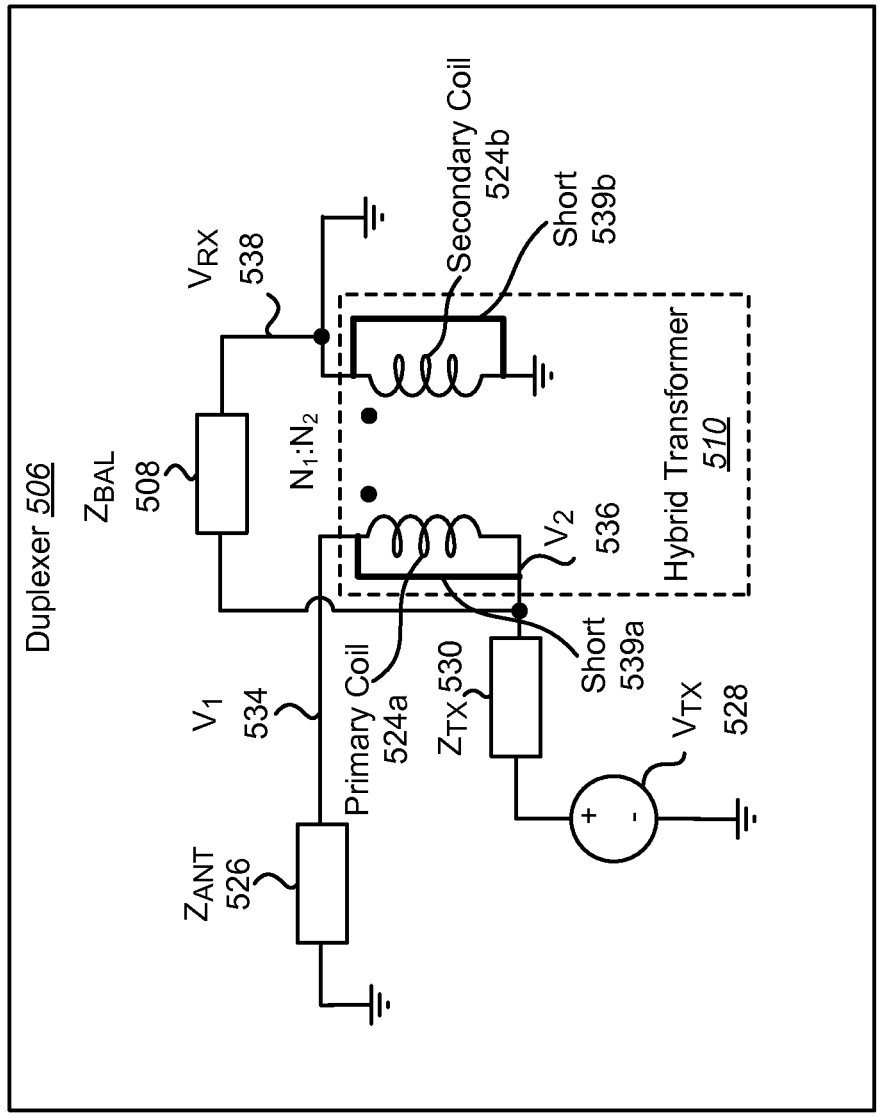
FIG. 5 is a circuit diagram illustrating the effect of the proper tuning of the balancing impedance $Z_{BAL}$ in a duplexer during transmission.

FIG. 5 is a circuit diagram illustrating the effect of the proper tuning of the balancing impedance $Z_{BAL}$ 508 in a duplexer 506 during transmission. The duplexer 506 of FIG. 5 may be one configuration of the duplexer 406 of FIG. 4. The duplexer 506 may include a hybrid transformer 510 with a primary coil 524a and a secondary coil 524b. The ratio of turns for the primary coil 524a to the secondary coil 524b may be $N_1:N_2$. As in FIG. 4, the power amplifier (PA) 112 is viewed as a Thevenin equivalent circuit that includes a voltage source $V_{TX}$ 528 and an impedance $Z_{TX}$ 530 coupled to each other. The voltage source $V_{TX}$ 528 may be coupled to ground while the impedance $Z_{TX}$ 530 is coupled to both the primary coil 524a of the hybrid transformer 510 and the balancing impedance $Z_{BAL}$ 508.

For transmit signal suppression at the receive port, the voltage $V_{RX}$ 538 during transmission should be zero. As discussed above, transmit signal suppression at the low noise amplifier (LNA) 114 input ports (i.e., the receive port) occurs when Equation (1) is satisfied. At transmit frequencies when Equation (1) is satisfied, both the primary coil 524a and the secondary coil 524b are shorted (i.e., the first short 539a and the second short 539b). Thus, the impedance $Z_{RX}$ 432 is coupled to ground on both sides and is effectively removed from the duplexer 506. Also, the voltage $V_1$ 534 is equal to the voltage $V_2$ 536. The voltage $V_2$ 536 may be found using Equation (2):

$$V_2 = V_1 - \left(\frac{N_1}{N_2}\right) \cdot V_{RX}. \quad (2)$$

When $V_{RX}=0$, $V_2=V_1$ (i.e., the primary coil 524a is shorted) and Equation (1) is satisfied. The power transmitted to the antenna 104 may be reduced due to the losses in the duplexer 506 impedance. An optimal transmit power transfer may occur when the impedance $Z_{TX}$ 530 is equal to the parallel combination of the balancing impedance $Z_{BAL}$ 508 and the impedance $Z_{ANT}$ 526 (i.e., $Z_{TX}=Z_{BAL}\|Z_{ANT}$). If $$\left(\frac{N_2}{N_1}\right) = n,$$

then the optimal transmit power transfer may occur when Equation (3) is satisfied:

$$Z_{TX} = \left(\frac{n}{n+1}\right) \cdot Z_{ANT}. \quad (3)$$

Figure 6:
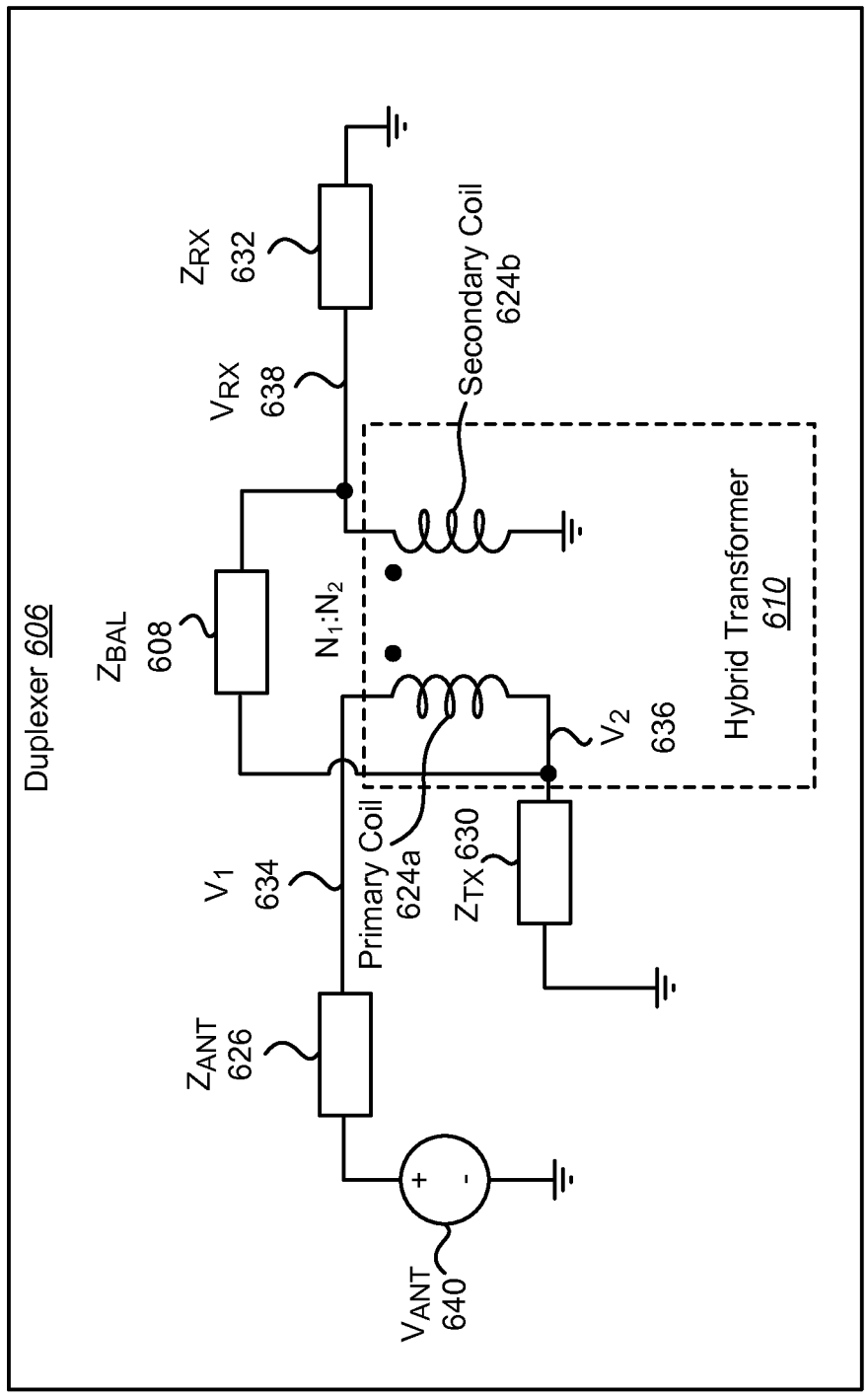
FIG. 6 is a circuit diagram illustrating a theoretical view of a duplexer with a hybrid transformer during reception.

FIG. 6 is a circuit diagram illustrating a theoretical view of a duplexer 606 with a hybrid transformer 610 during reception. The duplexer 606 of FIG. 6 may be one configuration of the duplexer 106 of FIG. 1. During reception, the antenna 104 may be viewed as a voltage source $V_{ANT}$ 640 coupled to an impedance $Z_{ANT}$ 626. The voltage source $V_{ANT}$ 640 may be coupled to ground. The impedance $Z_{ANT}$ 626 may be coupled to a primary coil 624a in the hybrid transformer 610. During reception, the power amplifier (PA) 112 may be viewed as an impedance $Z_{TX}$ 630 coupled between ground and both the primary coil 624a and the balancing impedance $Z_{BAL}$ 608. Also, during reception, the low noise amplifier (LNA) 114 may be viewed as an impedance $Z_{RX}$ 632 coupled between ground and both the balancing impedance $Z_{BAL}$ 608 and the secondary coil 624b of the hybrid transformer 610. The ratio of turns for the primary coil 624a to the secondary coil 624b may be $N_1:N_2$.

The duplexer 606 may have a voltage $V_1$ 634 at the node between the impedance $Z_{ANT}$ 626 and the primary coil 624a. The duplexer 606 may have a voltage $V_2$ 636 at the node between the primary coil 624a and the impedance $Z_{TX}$ 630. The duplexer 606 may also have a voltage $V_{RX}$ 638 at the node between the impedance $Z_{RX}$ 632 and the secondary coil 624b.

Figure 7:
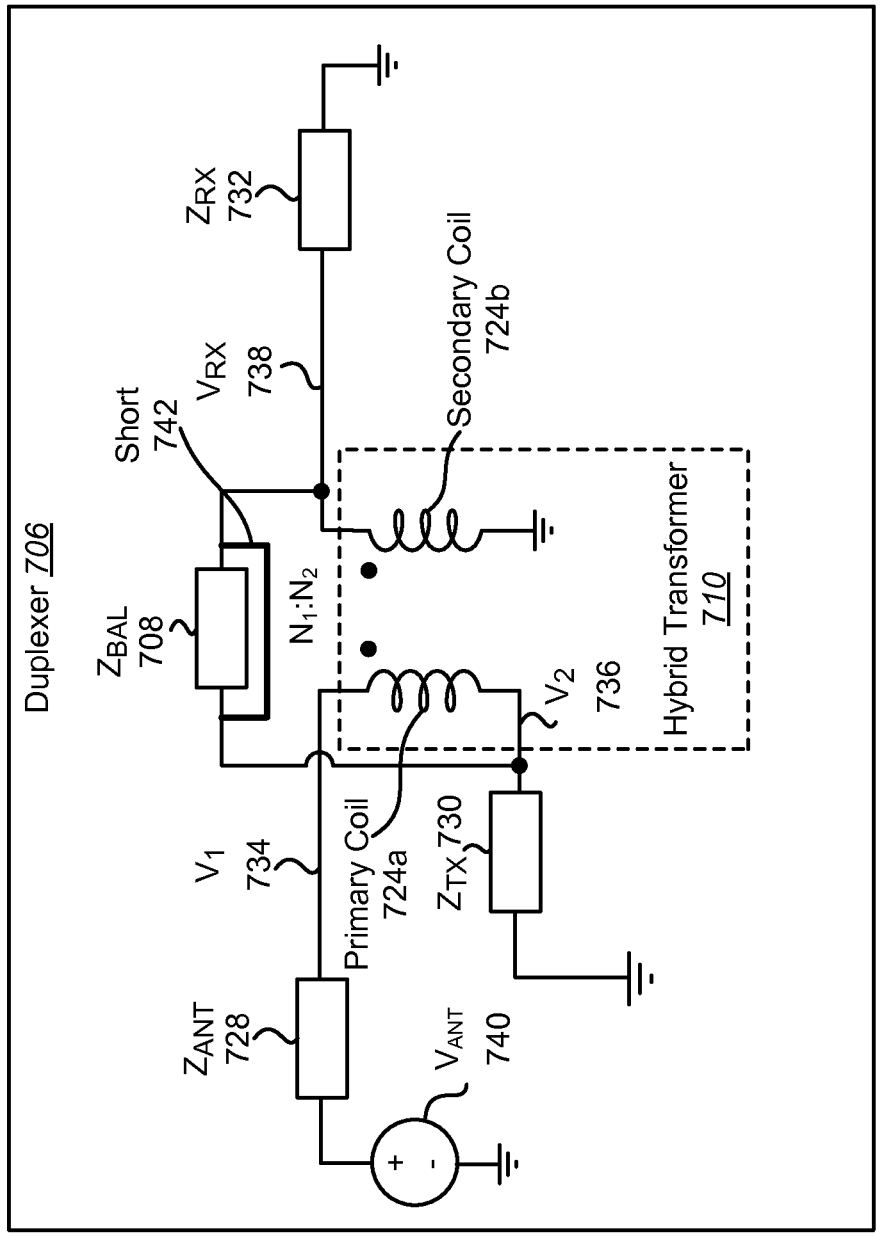
FIG. 7 is a circuit diagram illustrating the effect of the proper tuning of the balancing impedance $Z_{BAL}$ in a duplexer during reception.

FIG. 7 is a circuit diagram illustrating the effect of the proper tuning of the balancing impedance $Z_{BAL}$ 708 in a duplexer 706 during reception. The duplexer 706 of FIG. 7 may be one configuration of the duplexer 606 of FIG. 6. As in FIG. 6, the power amplifier (PA) 112 may be viewed during reception as an impedance $Z_{TX}$ 730 coupled between ground and both the balancing impedance $Z_{BAL}$ 708 and the primary coil 724a of a hybrid transformer 710. The antenna 104 may be viewed as a voltage source $V_{ANT}$ 740 coupled to an impedance $Z_{ANT}$ 728. The voltage source $V_{ANT}$ 740 may also be coupled to ground. The impedance $Z_{ANT}$ 728 may be coupled to the primary coil 724a. The low noise amplifier (LNA) 114 may be viewed as an impedance $Z_{RX}$ 732 coupled between ground and both the secondary coil 724b of the hybrid transformer 710 and the balancing impedance $Z_{BAL}$ 708.

The voltage between the impedance $Z_{ANT}$ 728 and the primary coil 724a may be referred to as $V_1$ 734. The voltage between the impedance $Z_{TX}$ 730 and the primary coil 724a may be referred to as $V_2$ 736. The voltage between the impedance $Z_{RX}$ 732 and the secondary coil 724b may be referred to as $V_{RX}$ 738. As discussed above, the maximum receive power transfer occurs when $V_2=V_{RX}$. This means that the optimum power transfer from the antenna 104 to the receive port (i.e., the output of the low noise amplifier (LNA) 114) may occur when the balancing impedance $Z_{BAL}$ 708 is shorted 742. Thus, the optimum Rx impedance needed for maximum power transfer from the antenna 104 to the Rx port can be derived as Equation (4):

$$Z_{RX} = \frac{\left(\frac{N_2}{N_1}\right) \cdot Z_{ANT}}{\left(1 + \frac{N_1}{N_2}\right)}. \tag{4}$$

If $$\frac{N_2}{N_1} = n,$$

then Equation (4) may be rewritten as Equation (5):

$$Z_{RX} = \left(\frac{n^2}{n+1}\right) \cdot Z_{ANT}. \tag{5}$$

Thus, when Equation (5) is satisfied, the optimum power transfer from the antenna 104 to the receive port occurs. When the impedance $Z_{RX}$ 732 is optimum, the balancing impedance $Z_{BAL}$ 708 is shorted 742 at the receive frequencies. By increasing $$\frac{N_2}{N_1} = n,$$

the transmit path insertion loss can be reduced at the expense of a bit higher receive path insertion loss.

Figure 8:
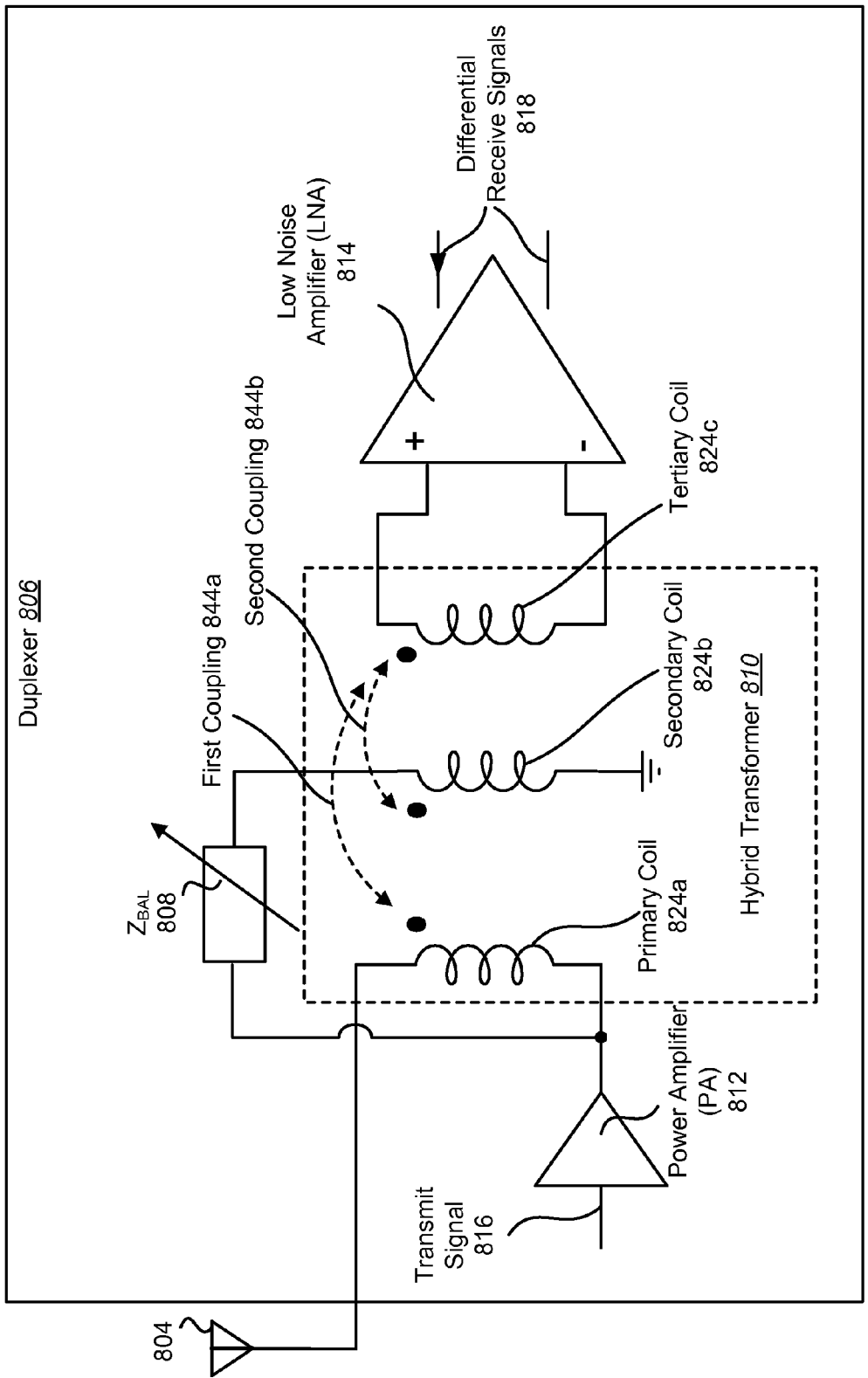
FIG. 8 is a circuit diagram illustrating a duplexer with a hybrid transformer and a differential low noise amplifier (LNA)

FIG. 8 is a circuit diagram illustrating a duplexer 806 with a hybrid transformer 810 and a differential low noise amplifier (LNA) 814. The duplexer 806 of FIG. 8 may be one configuration of the duplexer 106 of FIG. 1. The hybrid transformer 810 may include a primary coil 824a, a secondary coil 824b and a tertiary coil 824c.

The duplexer 806 may be coupled to an antenna 804. The antenna 804 may be used for both transmission and reception. The antenna 804 may be coupled to the primary coil 824a. The primary coil 824a may also be coupled to the output of a power amplifier (PA) 812. The power amplifier (PA) 812 may receive a transmit signal 816. The output of the power amplifier (PA) 812 may also be coupled to a balancing impedance $Z_{BAL}$ 808. As discussed above, the balancing impedance $Z_{BAL}$ 808 may be a differential tunable impedance. The secondary coil 824b may be coupled between the balancing impedance $Z_{BAL}$ 808 and ground. A first coupling 844a may occur between the primary coil 824a and the secondary coil 824b.

The tertiary coil 824c may be coupled between a first differential input of the differential low noise amplifier (LNA) 814 and a second differential input of the differential low noise amplifier (LNA) 814. A second coupling 844b may occur between the secondary coil 824b and the tertiary coil 824c. The differential low noise amplifier (LNA) 814 may output differential receive signals 818. The tertiary coil 824c may be used to generate purely differential receive signals while rejecting transmit common-mode signals. A similar analysis as used in FIGS. 4-7 above may be applied to the duplexer 806 in FIG. 9.

Figure 9:
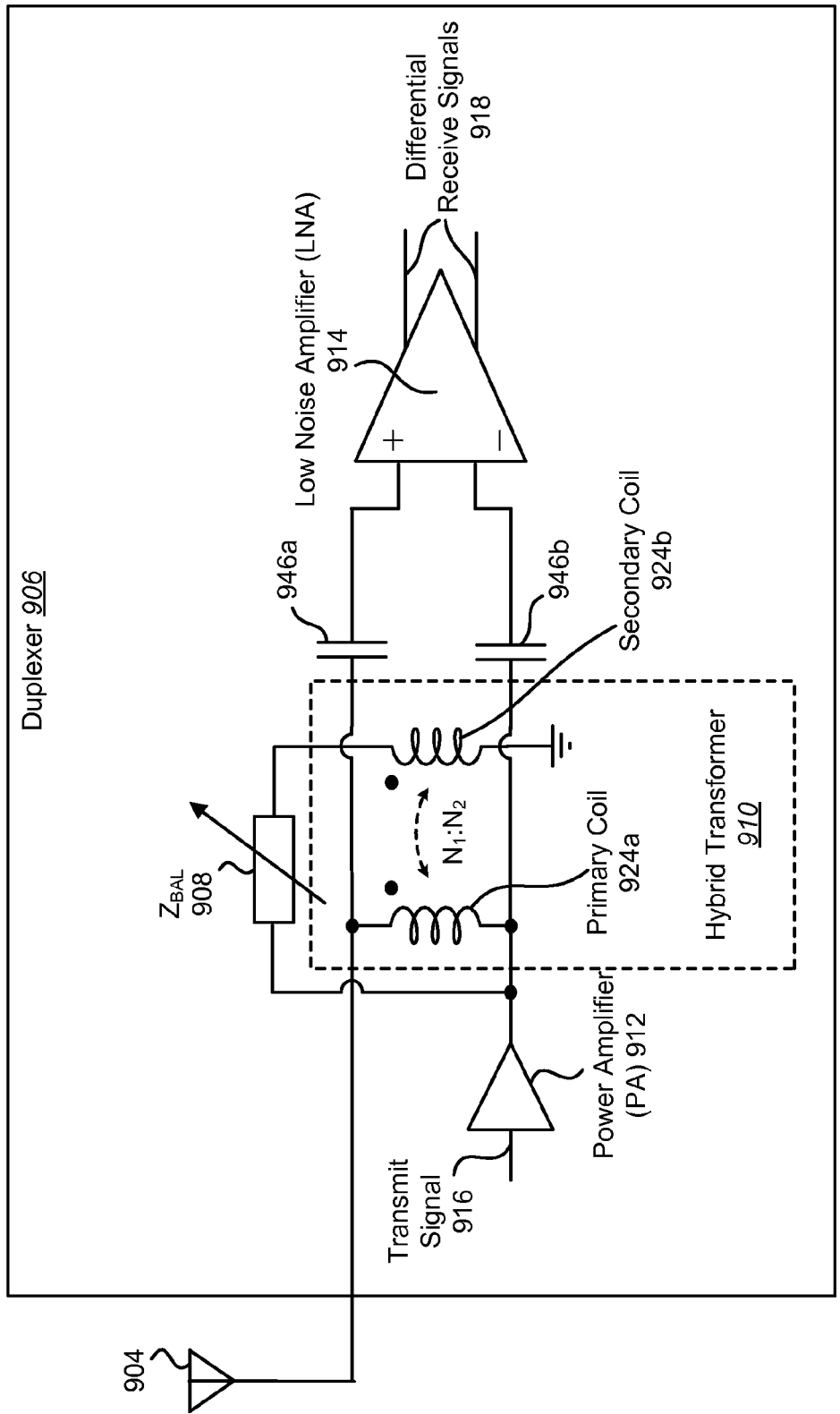
FIG. 9 is a circuit diagram illustrating another duplexer with a hybrid transformer and a differential low noise amplifier (LNA)

FIG. 9 is a circuit diagram illustrating another duplexer 906 with a hybrid transformer 910 and a differential low noise amplifier (LNA) 914. The duplexer 906 of FIG. 9 may be one configuration of the duplexer 106 of FIG. 1. The topology of FIG. 9 may not reject transmit common-mode signals at the +/− low noise amplifier (LNA) 914 inputs (the common-mode signals will still be rejected at the low noise amplifier (LNA) 814 output due to the differential nature of the low noise amplifier (LNA) 814). The duplexer 906 may include a hybrid transformer 910 that includes a primary coil 924a and a secondary coil 924b. The ratio of turns for the primary coil 924a to the secondary coil 924b may be $N_1:N_2$.

The duplexer 906 may be coupled to an antenna 904. The antenna 904 may be used for both transmission and reception. The antenna 904 may be coupled to both the primary coil 924a and a first capacitor 946a. The first capacitor 946a may also be coupled to a first differential input of the differential low noise amplifier (LNA) 914. The primary coil 924a may also be coupled to an output of a power amplifier (PA) 912, a second capacitor 946b and a balancing impedance $Z_{BAL}$ 908. The power amplifier (PA) 912 may receive a transmit signal 916. The second capacitor 946b may also be coupled to a second differential input of the differential low noise amplifier (LNA) 914. The differential low noise amplifier (LNA) 914 may output differential receive signals 918. The secondary coil 924b may be coupled between the balancing impedance $Z_{BAL}$ 908 and ground. The balancing impedance $Z_{BAL}$ 908 may be a differential tunable impedance. A similar analysis as used in FIGS. 4-7 above may be applied to the duplexer 906 in FIG. 9.

Figure 10:
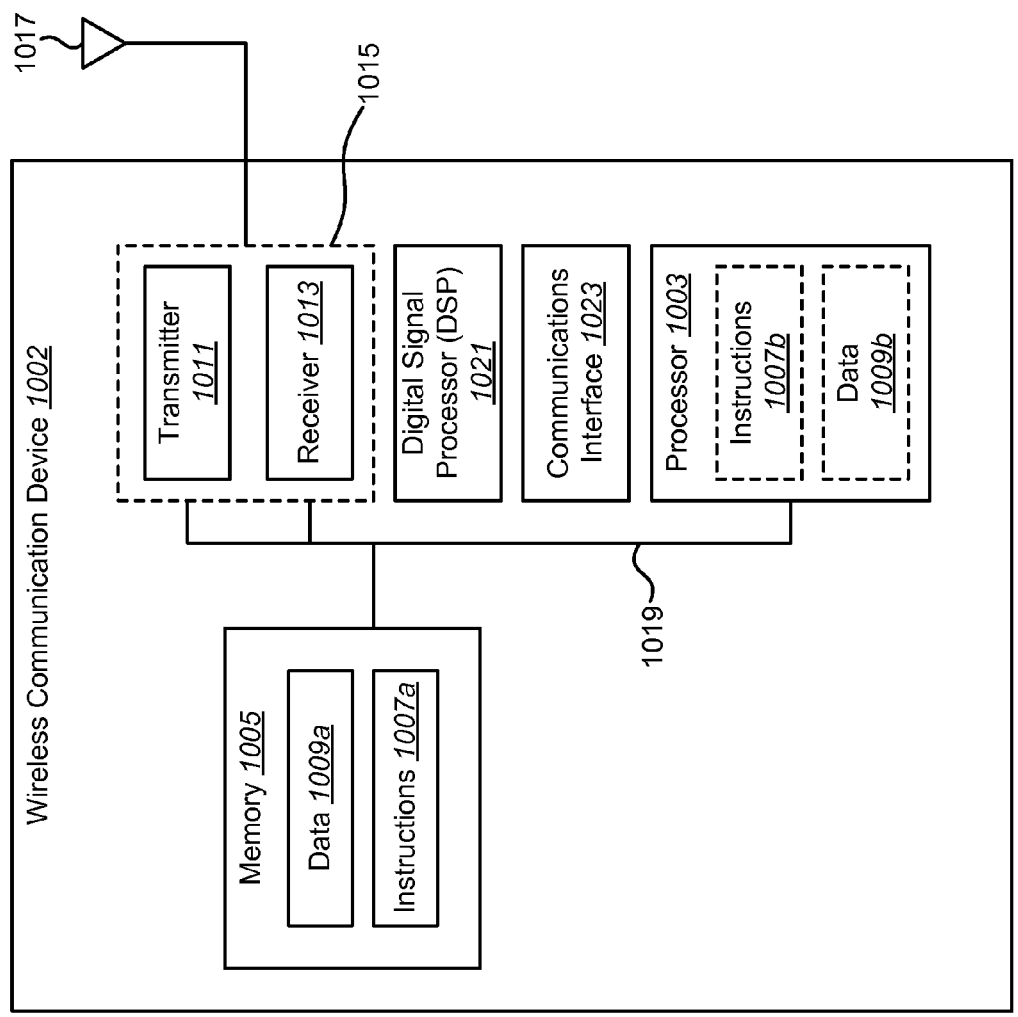
FIG. 10 illustrates certain components that may be included within a wireless communication device.

FIG. 10 illustrates certain components that may be included within a wireless communication device 1002. The wireless communication device 1002 of FIG. 10 may be one configuration of the wireless device 102 of FIG. 1. The wireless communication device 1002 may be an access terminal, a mobile station, a user equipment (UE), etc. The wireless communication device 1002 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless communication device 1002 of FIG. 10, in an alternative configuration, a combination of processors (e.g., an ARM and DSP) could be used.

The wireless communication device 1002 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof Data 1009a and instructions 1007a may be stored in the memory 1005. The instructions 1007a may be executable by the processor 1003 to implement the methods disclosed herein. Executing the instructions 1007a may involve the use of the data 1009a that is stored in the memory 1005. When the processor 1003 executes the instructions 1007, various portions of the instructions 1007b may be loaded onto the processor 1003, and various pieces of data 1009b may be loaded onto the processor 1003.

The wireless communication device 1002 may also include a transmitter 1011 and a receiver 1013 to allow transmission and reception of signals to and from the wireless communication device 1002 via an antenna 1017. The transmitter 1011 and receiver 1013 may be collectively referred to as a transceiver 1015. The wireless communication device 1002 may also include (not shown) multiple transmitters, multiple antennas, multiple receivers and/or multiple transceivers.

The wireless communication device 1002 may include a digital signal processor (DSP) 1021. The wireless communication device 1002 may also include a communications interface 1023. The communications interface 1023 may allow a user to interact with the wireless communication device 1002.

The various components of the wireless communication device 1002 may be coupled together by one or more buses, which may include a power bus, a control signal bus, a status signal bus, a data bus, etc. For the sake of clarity, the various buses are illustrated in FIG. 10 as a bus system 1019.

Figure 11:
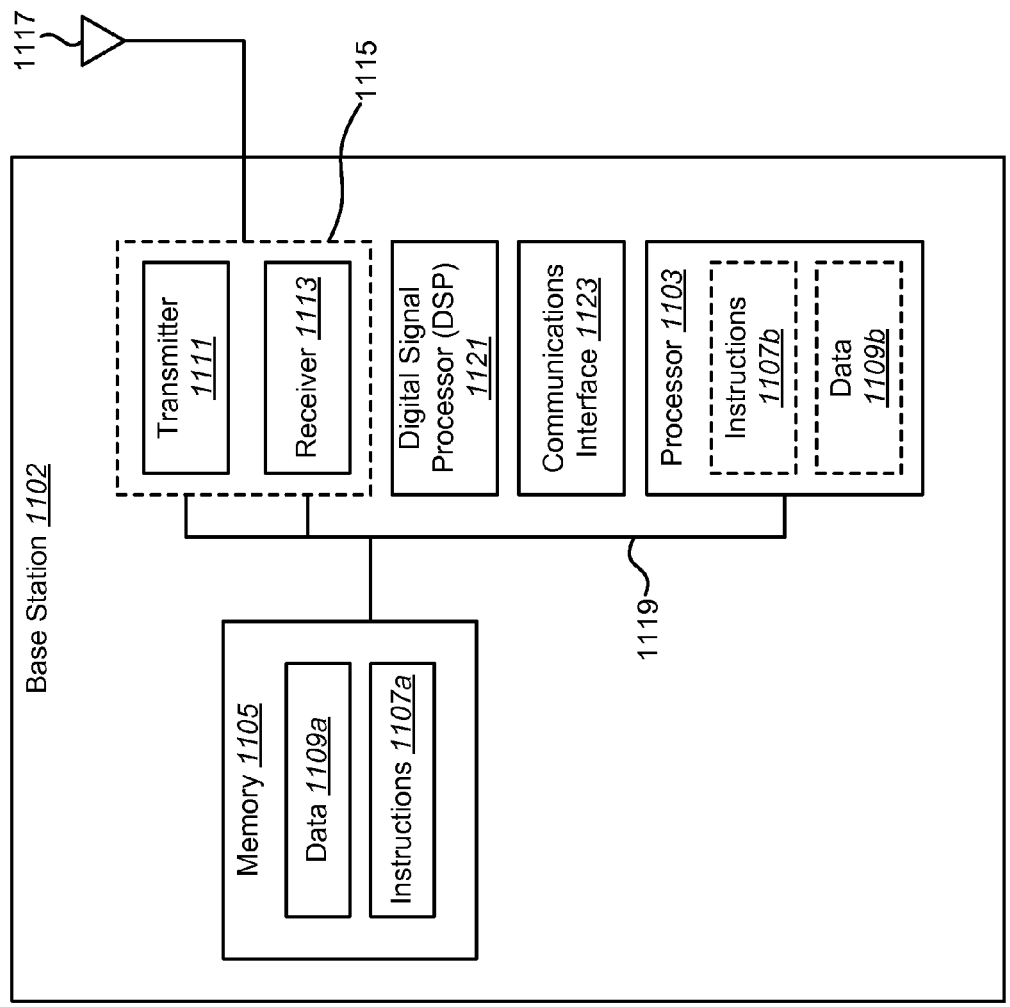
FIG. 11 illustrates certain components that may be included within a base station.

FIG. 11 illustrates certain components that may be included within a base station 1102. The base station 1102 of FIG. 11 may be one configuration of the wireless device 102 of FIG. 1. A base station may also be referred to as, and may include some or all of the functionality of, an access point, a broadcast transmitter, a NodeB, an evolved NodeB, etc. The base station 1102 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the base station 1102 of FIG. 11, in an alternative configuration, a combination of processors (e.g., an ARM and DSP) could be used.

The base station 1102 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1109a and instructions 1107a may be stored in the memory 1105. The instructions 1107a may be executable by the processor 1103 to implement the methods disclosed herein. Executing the instructions 1107a may involve the use of the data 1109a that is stored in the memory 1105. When the processor 1103 executes the instructions 1107a, various portions of the instructions 1107b may be loaded onto the processor 1103, and various pieces of data 1109b may be loaded onto the processor 1103.

The base station 1102 may also include a transmitter 1111 and a receiver 1113 to allow transmission and reception of signals to and from the base station 1102. The transmitter 1111 and receiver 1113 may be collectively referred to as a transceiver 1115. An antenna 1117 may be electrically coupled to the transceiver 1115. The base station 1102 may also include (not shown) multiple transmitters, multiple receivers, multiple transceivers and/or multiple antennas.

The base station 1102 may include a digital signal processor (DSP) 1121. The base station 1102 may also include a communications interface 1123. The communications interface 1123 may allow a user to interact with the base station 1102.

The various components of the base station 1102 may be coupled together by one or more buses, which may include a power bus, a control signal bus, a status signal bus, a data bus, etc. For the sake of clarity, the various buses are illustrated in FIG. 11 as a bus system 1119.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 3, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A duplexer, comprising:
   a hybrid transformer comprising:
      a primary coil coupled between an output of a power amplifier and an antenna; and
      a secondary coil coupled between an input of a low noise amplifier and ground; and
   a balancing impedance, wherein the balancing impedance is coupled between the primary coil and the secondary coil, wherein the secondary coil is coupled between the balancing impedance and the ground.

2. The duplexer of claim 1, wherein a coupling occurs between the primary coil and the secondary coil.

3. The duplexer of claim 1, wherein a transmit signal is input to the power amplifier.

4. The duplexer of claim 1, wherein a receive signal is output from the low noise amplifier.

5. The duplexer of claim 1, wherein the antenna is configured to simultaneously transmit and receive.

6. The duplexer of claim 1, wherein a ratio of turns for the primary coil to the secondary coil is $N_1:N_2$, and wherein the balancing impedance is tuned to equal $(N_2/N_1)$ multiplied by an impedance of the antenna.

7. The duplexer of claim 1, wherein the primary coil comprises two terminals, wherein the secondary coil comprises two terminals, and wherein the balancing impedance is tuned during transmission such that the two terminals of the primary coil and the two terminals of the secondary coil are shorted at transmit signal frequencies.

8. The duplexer of claim 1, wherein the balancing impedance is tuned during reception and the balancing impedance is shorted at receive signal frequencies.

9. The duplexer of claim 1, wherein the low noise amplifier is a differential low noise amplifier with a first differential input and a second differential input, and further comprising a tertiary coil coupled between the first differential input and the second differential input.

10. The duplexer of claim 9, wherein a first coupling occurs between the primary coil and the secondary coil, and wherein a second coupling occurs between the primary coil and the tertiary coil.

11. The duplexer of claim 1, wherein the low noise amplifier is a differential low noise amplifier with a first differential input and a second differential input, and further comprising:
   a first capacitor coupled between the first differential input and the antenna; and
   a second capacitor coupled between the second differential input and the output of the power amplifier.

12. A method for simultaneously transmitting and receiving, comprising:
   receiving a receive signal using an antenna;
   providing the received signal to a low noise amplifier via a duplexer that comprises a hybrid transformer;
   receiving a transmit signal from a power amplifier; and
   providing the transmit signal to the antenna via the duplexer;
   wherein the hybrid transformer comprises:
      a primary coil coupled between an output of the power amplifier and the antenna; and
      a secondary coil coupled between an input of the low noise amplifier and ground; and
   wherein the duplexer further comprises a balancing impedance, wherein the balancing impedance is coupled between the primary coil and the secondary coil, and wherein the secondary coil is coupled between the balancing impedance and the ground.

13. The method of claim 12, wherein a coupling occurs between the primary coil and the secondary coil.

14. The method of claim 12, wherein a transmit signal is input to the power amplifier.

15. The method of claim 12, wherein a receive signal is output from the low noise amplifier.

16. The method of claim 12, wherein the antenna simultaneously transmits and receives.

17. The method of claim 12, wherein a ratio of turns for the primary coil to the secondary coil is $N_1:N_2$, and wherein the balancing impedance is tuned to equal $(N_2/N_1)$ multiplied by an impedance of the antenna.

18. The method of claim 12, wherein the balancing impedance is tuned during transmission and the primary coil and the secondary coil are shorted at transmit signal frequencies.

19. The method of claim 12, wherein the balancing impedance is tuned during reception and the balancing impedance is shorted at receive signal frequencies.

20. The method of claim 12, wherein the low noise amplifier is a differential low noise amplifier with a first differential input and a second differential input, and wherein the duplexer further comprises a tertiary coil coupled between the first differential input and the second differential input.

21. The method of claim 20, wherein a first coupling occurs between the primary coil and the secondary coil, and wherein a second coupling occurs between the primary coil and the tertiary coil.

22. The method of claim 12, wherein the low noise amplifier is a differential low noise amplifier with a first differential input and a second differential input, and wherein the duplexer further comprises:
    a first capacitor coupled between the first differential input and the antenna; and
    a second capacitor coupled between the second differential input and the output of the power amplifier.

23. A wireless device configured for simultaneously transmitting and receiving, comprising:
    means for receiving a receive signal;
    means for providing the receive signal to a low noise amplifier via a duplexer that comprises a hybrid transformer;
    means for receiving a transmit signal from a power amplifier; and
    means for providing the transmit signal to an antenna via the duplexer;
    wherein the hybrid transformer comprises:
        a primary coil coupled between an output of the power amplifier and the antenna; and
        a secondary coil coupled between an input of the low noise amplifier and the ground; and
    wherein the duplexer comprises a balancing impedance, wherein the balancing impedance is coupled between the primary coil and the secondary coil, and wherein the secondary coil is coupled between the balancing impedance and the ground.

24. The wireless device of claim 23, wherein a coupling occurs between the primary coil and the secondary coil.

25. A computer-program product for simultaneous transmission and reception, the computer-program product comprising a non-transitory computer-readable medium having instructions thereon, the instructions comprising:
    code for causing a wireless device to receive a receive signal using an antenna;
    code for causing the wireless device to provide the receive signal to a low noise amplifier via a duplexer that comprises a hybrid transformer;
    code for causing the wireless device to receive a transmit signal from a power amplifier; and
    code for causing the wireless device to provide the transmit signal to the antenna via the duplexer;
    wherein the hybrid transformer comprises:
        a primary coil coupled between an output of the power amplifier and the antenna; and
        a secondary coil coupled between an input of the low noise amplifier and ground; and
    wherein the duplexer comprises a balancing impedance, wherein the balancing impedance is coupled between the primary coil and the secondary coil, and wherein the secondary coil is coupled between the balancing impedance and the ground.

26. The computer-program product of claim 25, wherein a coupling occurs between the primary coil and the secondary coil.

* * * * *